(12) United States Patent
Elbornsson

(10) Patent No.: US 7,084,793 B2
(45) Date of Patent: Aug. 1, 2006

(54) METHOD AND DEVICE FOR ESTIMATING TIME ERRORS IN TIME INTERLEAVED A/D CONVERTER SYSTEM

(75) Inventor: Jonas Elbornsson, Linköping (SE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/183,131

(22) Filed: Jul. 15, 2005

(65) Prior Publication Data
US 2006/0017599 A1    Jan. 26, 2006

Related U.S. Application Data

(63) Continuation of application No. PCT/SE2004/000039, filed on Jan. 15, 2004.

(30) Foreign Application Priority Data
Jan. 15, 2003 (SE) .................. 0300093

(51) Int. Cl.
 *H03M 1/06* (2006.01)
(52) U.S. Cl. .................. 341/118; 341/155

(58) Field of Classification Search ........ 341/110–120, 341/155
See application file for complete search history.

(56) References Cited

U.S. PATENT DOCUMENTS

| | | | | |
|---|---|---|---|---|
| 5,294,926 A | * | 3/1994 | Corcoran | 341/118 |
| 6,081,215 A | * | 6/2000 | Kost et al. | 341/118 |
| 6,522,282 B1 | * | 2/2003 | Elbornsson | 341/118 |
| 2002/0093439 A1 | | 7/2002 | Lundin et al. | 341/120 |

FOREIGN PATENT DOCUMENTS

WO    0249217    6/2002

* cited by examiner

*Primary Examiner*—Lam T. Mai
(74) *Attorney, Agent, or Firm*—Baker Botts L.L.P.

(57) ABSTRACT

A device estimates time errors in a time interleaved A/D converter system. To this end an output signal (y1, y2, ..., yM) is fed to a correction device (5), that is provided to correct the signals with an estimated time error and to produce M signals (z1, z2, ..., zM). These signals are used in an estimation algorithm device to estimate the time error and the time estimated time errors are then fed to the correction device (5).

6 Claims, 3 Drawing Sheets

US 7,084,793 B2

METHOD AND DEVICE FOR ESTIMATING TIME ERRORS IN TIME INTERLEAVED A/D CONVERTER SYSTEM

CROSS REFERENCE TO RELATED APPLICATION

This application is a continuation of copending International Application No. PCT/SE2004/000039 filed Jan. 15, 2004, which designates the United States, and claims priority to Swedish application number 0300093-2 filed Jan. 15, 2003.

TECHNICAL FIELD

Modern signal processing applications require higher and higher sample rates on the A/D converters. One way to increase the sample rate is to use several A/D converters in parallel, interleaved in time. One problem with this solution is that time mismatch errors are introduced because of the parallel structure. The present invention relates to a method and a device for estimating the time errors in a time interleaved A/D Converter, or ADC, System. As opposed to other methods and devices this method and device function in the background and do not require any special calibration signal. The estimates that the method and device generate will also be asymptotically unbiased.

BACKGROUND

Many digital signal processing applications, such as radio base stations or VDSL modems, require A/D converters with very high sample rate and very high accuracy. To achieve high enough sample rates, an array of M A/D converters or ADCs, interleaved in time, can be used. Each ADC should work at 1/M th of the desired sample rate [7], see FIG. 1. In FIG. 1 a parallel ADC system is shown consisting of a plurality of single or individual ADCs 1, even called ADC cells or ADC channels, which convert successively sampled values in a cyclical process, the conversion in each cell is performed in parallel with the conversion in the other cells. The conversion process in each cell starts at successive times for successively sampled analog values. An analog signal u(t) is input to the device on a line 2. A sampling clock signal is input to control terminals of the ADC cells on a line 3 and is successively delayed by delay elements 4 connected to the clock input line. The signals provided to the control terminals command the start of the conversion procedure in the respective ADC cell. The M output signals from the ADC cells, y1 to yM, are connected to a MUX 5. The MUX puts the signals y1 to yM together to form one output signal y. The delay elements and input circuits of the ADC cells cause time offset errors.

Three kinds of mismatch errors are introduced by the interleaved structure:

Time Errors or Static Jitter:

The delay time of the clock to the different A/D converters is not equal. This means that the signal will be periodically but non-uniformly sampled.

Amplitude Offset Errors:

The ground level can be slightly different in the different A/D converters. This means that there is constant amplitude offset in each A/D converter.

Gain Error:

The gain, from analog input to digital output, can be different for the different A/D converters.

The errors listed above are assumed to be static, so that the error is the same in the same A/D converter from one cycle to the next. There are also random errors due to for instance thermal noise and quantization, which are different from one sample to the next. These errors do not have anything to do with the parallel structure of the A/D converter and are impossible to estimate because of their random behavior. The random errors are however important to study for the robustness of the estimation algorithm and to calculate lower bounds on the estimation accuracy.

The main random errors in an A/D converter are:

Quantization:

This is a deterministic error, if the input signal is known. But for most signals it can be treated as additive white noise uncorrelated with the input signal and with uniform distribution [11].

Random Jitter:

Due to noise in the clock signal there is a random error on the sampling instances. These errors can be treated as Gaussian white noise on the sampling instances.

SUMMARY

In a method for calculating values of the timing offsets of the cells in a parallel A/D converter the input signal is basically unknown. Thus an algorithm works without any calibration signal. The timing offset estimation works well for signals bandlimited to the Nyquist frequency. The present invention relates to a method and device for time error estimation and signal reconstruction for a parallel A/D converter system. This is an improvement of the estimation method presented and evaluated in [3,2,5,4]. In the estimation method presented here, the bias estimation error is eliminated asymptotically as long as the input signal is bandlimited. This means that the estimation accuracy can be arbitrarily good depending only on the number of data. Methods for estimation of timing errors have also been presented in for instance [1] and [8] but those methods require a known calibration signal. Calibration of A/D converters is time-consuming and expensive. Therefore a lot of costs can be saved if the errors in the ADC can be automatically estimated and compensated for under drift.

DETAILED DESCRIPTION

Figure 1:
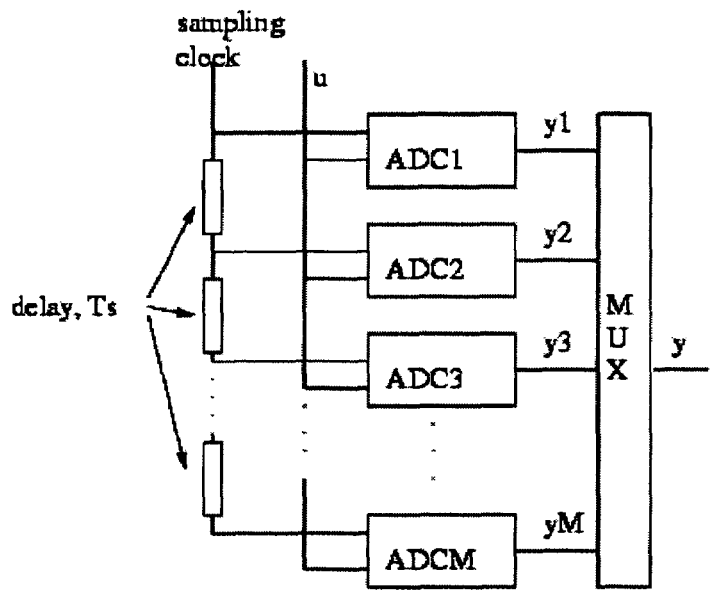
FIG. 1 is a block diagram of M parallel ADCs controlled by the same master clock.

The nominal-sampling interval that we would have without time errors is denoted $T_s$. M denotes the number of A/D converters in the time-interleaved array. The time error parameters are denoted $\Delta_{t_i}, i=0,\ldots,M-1$. The estimates of these errors are denoted $\hat{\Delta}_{t_i}, i=0,\ldots,M-1$, and the true errors are denoted $\Delta_{t_i}^0, i=0,\ldots,M-1$. The following notations are used for the signals involved: u(t) is the analog input signal, u[k] denotes an artificial signal, sampled without time errors, $u_i[k]$ denotes the M subsequences of $u[k]$ and $y_i[k]$ are the output subsequences from the M A/D converters, sampled with time errors.

$$y_i[k] = u((kM+i)T_s + \Delta_{t_i}^0) \tag{1}$$

y[m] is the multiplexed output signal from all the A/D converters.

$$y[m] = y_{(m \bmod M)}\left[\left\lfloor \frac{m}{M} \right\rfloor\right] \tag{2}$$

$z^{(\Delta_t)}[m]$ denote the output signal, $y[m]$, reconstructed with the error parameters, $\Delta_{t_i}.z_i^{(\Delta_{t_i})}[k]$ are the subsequences of $z^{(\Delta_t)}[m].u(t)$ is assumed to be bandlimited to the Nyquist frequency.

In the following section a few definitions are established, which will be used later.

[Quasi-stationary signal [9]] A signal u(t) is quasi-stationary if $$m = \lim_{N \to \infty} \frac{1}{N} \int_0^N E(u(t)) dt \tag{3}$$

$$R_u(\tau) = \lim_{N \to \infty} \frac{1}{N} \int_0^N E(u(t)u(t+\tau)) dt$$

exist, where the expectation is taken over possible stochastic parts. A stationary stochastic process is quasi-stationary, with m and $R_u(\tau)$ being the mean value and covariance function respectively. [Quasi-stationary spectrum [9]] Assume that u(t) is quasi-stationary. Then the power spectrum of s(t) is defined as:

$$\Phi_u(\omega) = \int_{-\infty}^{\infty} R_u(\tau) e^{-j\omega\tau} d\tau \tag{4}$$

[Modulo M quasi-stationary] Assume that $$\bar{g}_{y_{i_1}, y_{i_2}, \ldots} = \lim_{N \to \infty} \frac{1}{N} \sum_{t=1}^{N} g(y_{i_1}[t], y_{i_2}[t], \ldots) \tag{5}$$

$$i_1, i_2, \ldots = 0, \ldots, M-1$$

exists for a function $g(\bullet, \bullet,)$. Then y is modulo M quasi-stationary with respect to g if:

$$\bar{g}_{i_1, i_2, \ldots} = \bar{g}_{i_1+l) \bmod M, (i_2+l) \bmod M, \ldots}$$

$$\forall l \in \{\ldots, -1, 0, 1, \ldots\} \tag{6}$$

The modulo M quasi-staionarity property guarantees that the signal has the same statistical properties in all the A/D converters in the time interleaved array.

The mean value of the compensated output signals are defined as:

$$\bar{m}_{z_1}^{(\Delta_{i_1})} = \lim_{N \to \infty} \frac{1}{N} \sum_{k=1}^{N} E\left\{z_i^{(\Delta_{i_1})}[k]\right\} \tag{7}$$

The mean square value of the compensated output signals are defined as:

$$(\bar{\sigma}_{z_i}^2)^{(\Delta_{i_1})} = \lim_{N \to \infty} \frac{1}{N} \sum_{k=1}^{N} E\left\{\left(z_i^{(\Delta_{i_1})}[k]\right)^2\right\} \tag{8}$$

The mean square difference between the compensated output of the ith and jth A/D converters is defined as:

$$R_{z_i, z_j}^{(\Delta_t)}[l] = \lim_{N \to \infty} \frac{1}{N} \sum_{k=1}^{N} E\left\{\left(z_{i \bmod M}^{(\Delta_t)}\left[k + \left\lfloor \frac{i}{m} \right\rfloor\right] + l\right) - \right.$$

$$\left. z_{(j \bmod M)}^{(\Delta_t)}\left[k + \left\lfloor \frac{i}{M} \right\rfloor\right]\right)^2\right\} \tag{9}$$

where $\lfloor \rfloor$ denotes integer part.

If the input signal is band limited to the Nyquist frequency, $$\frac{\pi}{T_s},$$

and the time error parameters are known, the input signal can be perfectly reconstructed from the irregular samples. From [10] the following result will be:

1. General Signal Reconstruction:
    First the notation $$\alpha_i = -\frac{M-1}{2} + i + \Delta_{t_1}$$

is introduced for notational simplicity. The equation system is solved $$\sum_{i=0}^{M-1} e^{j\alpha_i \omega} H_i(\omega, t) = 1 \tag{10}$$

$$\sum_{i=0}^{M-1} e^{j\alpha_i \left(\omega + \frac{2\pi}{MT_s}\right)} H_i(\omega, t) = e^{j\frac{2\pi}{MT_s}t}$$

$$\vdots$$

$$\sum_{i=0}^{M-1} e^{j\alpha_i \left(\omega + (M-1)\frac{2\pi}{MT_s}\right)} H_i(\omega, t) = e^{j(M-1)\frac{2\pi}{MT_s}t}$$

for $H_i(\omega, t)$. The input signal can then be calculated at any time instance as:

$$u(t) = \sum_{k=-\infty}^{\infty} \sum_{i=0}^{M-1} y_i[k] h_i(t - kMT_s) \quad (11)$$

where $$h_i(t) = \frac{MT_s}{2\pi} \int_{-\pi/T_s}^{-\pi/T_s + 2\pi/(MT_s)} H_i(\omega, t) e^{j\omega t} d\omega$$

However, this signal reconstruction is computationally demanding, it can be simplified if only the signal is needed at the nominal sampling instances:

2. Sampled Signal Reconstruction:

Assume a reconstruction of the signal at the time instances:

$t = (kM+L)T_s$ $l = 0, \ldots, M-1, k = \ldots, -1, 0, 1, \ldots \quad (12)$

The right hand side of (10) is then independent of k. Further, the right hand side can be factorized into one diagonal matrix, which depends on, ω and one matrix independent of ω:

$$AE(\omega) H^{(l)}(\omega) = B_l \quad (13)$$

$$A = \begin{bmatrix} 1 & \ldots & 1 \\ e^{j\alpha_0 \frac{2\pi}{MT_s}} & \ldots & e^{j\alpha_{M-1} \frac{2\pi}{MT_s}} \\ \vdots & & \vdots \\ e^{j\alpha_0(M-1)\frac{2\pi}{MT_s}} & \ldots & e^{j\alpha_{M-1}(M-1)\frac{2\pi}{MT_s}} \end{bmatrix} \quad (14)$$

$$E(\omega) = \begin{bmatrix} e^{j\alpha_0 \omega} 0 \ldots 0 \\ 0 e^{j\alpha_1 \omega} \ldots 0 \\ \vdots \\ 0 0 \ldots e^{j\alpha_{M-1} \omega} \end{bmatrix} \quad (15)$$

$$B_l = [1 e^{j2\pi l/M} \ldots e^{j2\pi(M-1)l/M}]^T \quad (16)$$

Since only $E(\omega)$ depends on ω and the time dependence is removed, the coefficients can easily be calculated: $h_i^{(l)}(k) = h_i((kM+l)T_s)$ $$h^{(l)}(k) = \frac{MT_s}{2\pi} \int_{2/1}^{1/2} E^{-1}(\omega) e^{j\omega(kM+l)T_s} d\omega A^{-1} B_l \quad (17)$$

$\gamma_1 = \pi/T_s, \gamma_2 = -\pi/T_s + 2\pi/(MT_s)$

From here on M is assumed to be even, M odd gives similar calculations. Calculating the TDFT of the subsequences $h^{(l)}(k)$ gives:

$$H^{(l)}(e^{j\omega MT_s}) = MT_s \sum_{k=-\infty}^{\infty} h^{(l)}(k) \quad (18)$$

$$= \frac{(MT_s)^2}{2\pi} \int_{-\pi/T_s}^{-\pi/T_s + 2\pi/(MT_s)} E^{-1}(\gamma) e^{j\gamma lT_s}$$

$$\sum_{k=-\infty}^{\infty} e^{j\gamma kMT_s} e^{-j\omega kMT_s} d\gamma A^{-1} B_l$$

-continued $$= MT_s \sum_{r=-\infty}^{\infty} \int_{-\pi/T_s}^{-\pi/T_s + 2\pi/(MT_s)} E^{-1}(\gamma) e^{j\gamma lT_s} \delta$$

$$\left(\gamma - \omega + r\frac{2\pi}{MT_s}\right) d\gamma A^{-1} B_l$$

$$= MT_s E^{-1}\left(\omega - \frac{\pi}{T_s}\right) e^{j\omega lT_s} (-1)^l A^{-1} B_l$$

$$0 \leq \omega < \frac{2\pi}{MT_s}$$

The subsequences $Z_i^{(\Delta_t^0)}(e^{j\omega MT_s})$ can then be calculated as:

$$\left(Z_l^{(\Delta_t^0)}\right)(e^{j\omega MT_s}) \& = Y^T(e^{j\omega MT_s}) MT_s E^{-1}\left(\omega - \frac{\pi}{T_s}\right) \quad (19)$$

$$e^{j\omega l}(-1)^l A^{-1} B_l$$

where $Y^T(e^{j\omega MT_s}) = [Y_0(e^{j\omega MT_s}) \ldots Y_{M-1}(e^{j\omega MT_s})]$ The TDFT of the time error compensated signal, $Z^{(\Delta_t^0)}(e^{j\omega T_s})$, can then be calculated from its subsequence [6]:

$$Z^{(\Delta_t^0)}(e^{j\omega T_s}) = \sum_{l=0}^{M-1} Z_l^{(\Delta_t^0)}(e^{j\omega MT_s 2\pi}) e^{-jl\omega T_s} \quad (20)$$

In the following section an algorithm is presented for estimation of time errors in an time interleaved A/D converter system. The estimation algorithm functions in the background when the A/D converter is used, i.e., no special calibration signal is required. It will be assumed that the error is to be zero in the first A/D converter, $\Delta_{t_0}^0 = 0$, i.e., all the other errors are relative to the time error in the first ADC. This is no restriction since only the same distance is wanted between all samples, and the absolute sampling times are not important. The parameter estimates are adapted with a stochastic gradient algorithm:

Requirements for time error estimation:

1. The algorithm requires no knowledge about the input signal, except that it should be band limited to the Nyquist frequency for the whole ADC system.
2. The true error parameters must be smaller than half the sampling interval, $\Delta_{t_i}^0 < T_s/2$. This basically only means that the samples have to be taken in the correct order.

Initialization:

1. Collect a batch of N samples from each A/D converter, $y_i[k], i=0, \ldots, M-1$.
2. Initialize the step length of the stochastic gradient algorithm, μ.
3. Initialize the parameter estimates, $\hat{\Delta}_{t_i}^{(0)} = 0, i=0, \ldots, M-1$.
4. Initialize an iteration counter n=0.
5. Define how many time lags, L, that should be used in the estimation loss function.
6. Define the loss function weighting parameter β.

Adaptation:

1. Calculate the output signal, corrected with $\hat{\Delta}_{t_i}^{(n)} = 0, i=0, \ldots, M-1$:

$Z_i^{\hat{\Delta}_{t_i}^{(n)}} = \text{IDFT} Z_i^{\hat{\Delta}_{t_i}^{(n)}}$ where $Z_i^{\hat{\Delta}_{t_i}^{(n)}}$ is calculated from y[k] according to Section 3.

2. Calculate the mean square difference between adjacent ADCs:

$$R_{z_i,z_{i-1}}^{(\Delta_t^{(n)})}[l] = \lim_{N\to\infty} \frac{1}{N} \sum_{k=1}^{N} E\left\{\left(z_{i\,modM}^{(\Delta_t^{(n)})}\left[k+\left\lfloor\frac{i}{M}\right\rfloor+l\right]-\right.\right.$$
$$\left.\left. z_{i\,modM}^{(\Delta_t^{(n)})}\left[k+\left\lfloor\frac{i-1}{M}\right\rfloor\right]\right)^2\right\} \quad (22)$$

$i = 0, \ldots, M-1, l = 0, \ldots, L$

3. Calculate the mean square for each compensated ADC output:

$$(\sigma_{z_i}^2)^{(\Delta_{t_i}^{(n)})} = \lim_{N\to\infty} \frac{1}{N} \sum_{k=1}^{N} E\left\{\left(z_i^{(\Delta_{t_i}^{(n)})}[k]\right)^2\right\} \; i = 0, \ldots, M-1 \quad (23)$$

4. Calculate the loss function $V(\hat{\Delta}^{(i)})$ $$V(\hat{\Delta}^{(i)}) = \sum_{l=0}^{L} \sum_{i,j} \left(R_{z_i,z_{i-1}}^{(\Delta_t^{(n)})}[l] - R_{z_j,z_{j-1}}^{(\Delta_t^{(n)})}[l]\right)^2 +$$
$$\beta \sum_{i,j} \left((\sigma_{z_i}^2)^{(\Delta_{t_i}^{(n)})} - (\sigma_{z_j}^2)^{(\Delta_{t_j}^{(n)})}\right)^2 \quad (24)$$

5. Calculate the gradient of the loss function, $\nabla V(\hat{\Delta}^{(n)})$.
6. Update the parameter estimates in the negative gradient direction:

$$\hat{\Delta}^{(n+1)} = \hat{\Delta}^{(n)} - \mu \nabla V(\hat{\Delta}^{(n)}) \quad (25)$$

7. Calculate $V(\hat{\Delta}^{(n+1)})$, if $V(\hat{\Delta}^{(n+1)}) > V(\hat{\Delta}^{(n)})$ update $\mu:=$point $\mu:=\mu/2$ and return to 6.
8. Collect a new batch of data and continue the estimation update from point 2.

Figure 2:
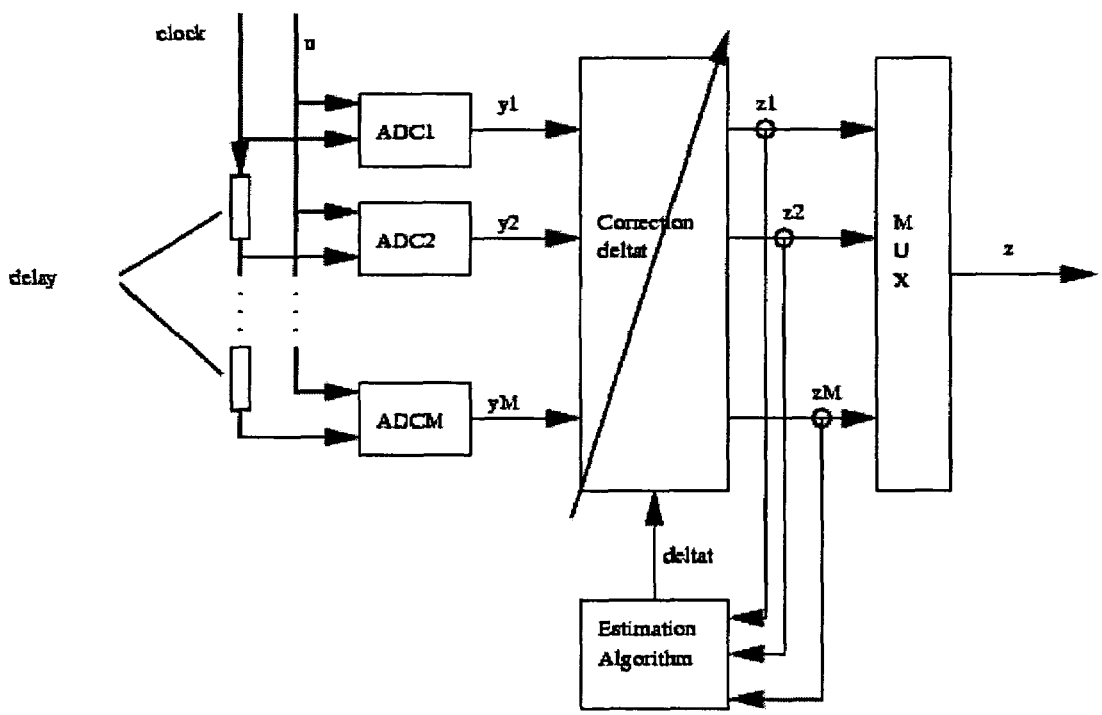
FIG. 2 is a block diagram of a time interleaved ADC system with estimation and correction of time errors according to the invention.

The time interleaved ADC system with estimation and correction of time errors is described in FIG. 2. The system consists of a plurality of single or individual ADCs 6, even called ADC cells or ADC channels: ADC1 to ADCM, which convert successively sampled values in a cyclical process, the conversion in each cell is performed in parallel with the conversion in the other cells. The conversion process in each cell starts at successive times for successively sampled analog values. Each ADC cell works with a sampling interval of MTs. The sampling rate for the complete system is Ts. An analog signal u(t) is input to the device on a line 7. A sampling clock is input to control terminals of the ADC cells on a line 8. Delay elements 9, with a delay of Ts, is used on the clock signal between the ADCs. The signals provided to the control terminals command the start of the conversion procedure in the respective ADC cell. The input signal, u, is connected to all the ADCs. The input signal must be band limited to the Nyquist frequency for the whole ADC system. The M output signals y1 to yM are connected to a correction device 10 that corrects the signals with the estimated time errors delta t, Δt, and produces the M signals z1 to zM. The signals z1 to zM are used in the estimation algorithm device 11, where the time errors delta t, Δt, are estimated. The estimated time errors delta t, Δt, are then connected back to the correction device. The signals z1 to zM are also connected to a MUX 12, where the signals are multiplexed together to form one signal, z. The signal z is corrected from the time errors and is sampled with the sampling interval Ts.

Figure 3:
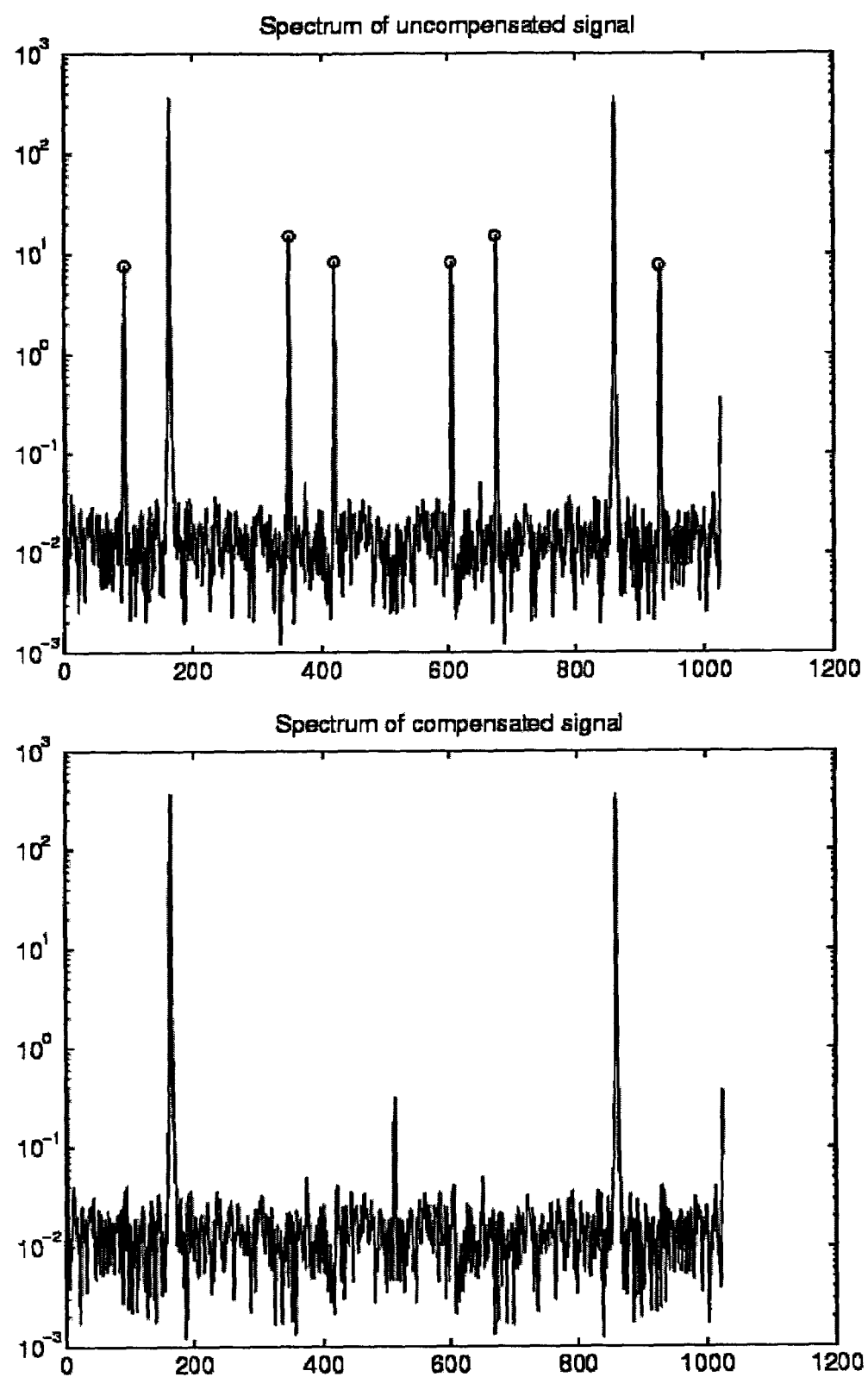
FIG. 3 is a diagram illustrating the spectrum of a sinusoidal signal before and after time error estimation and compensation.
Figure 4:
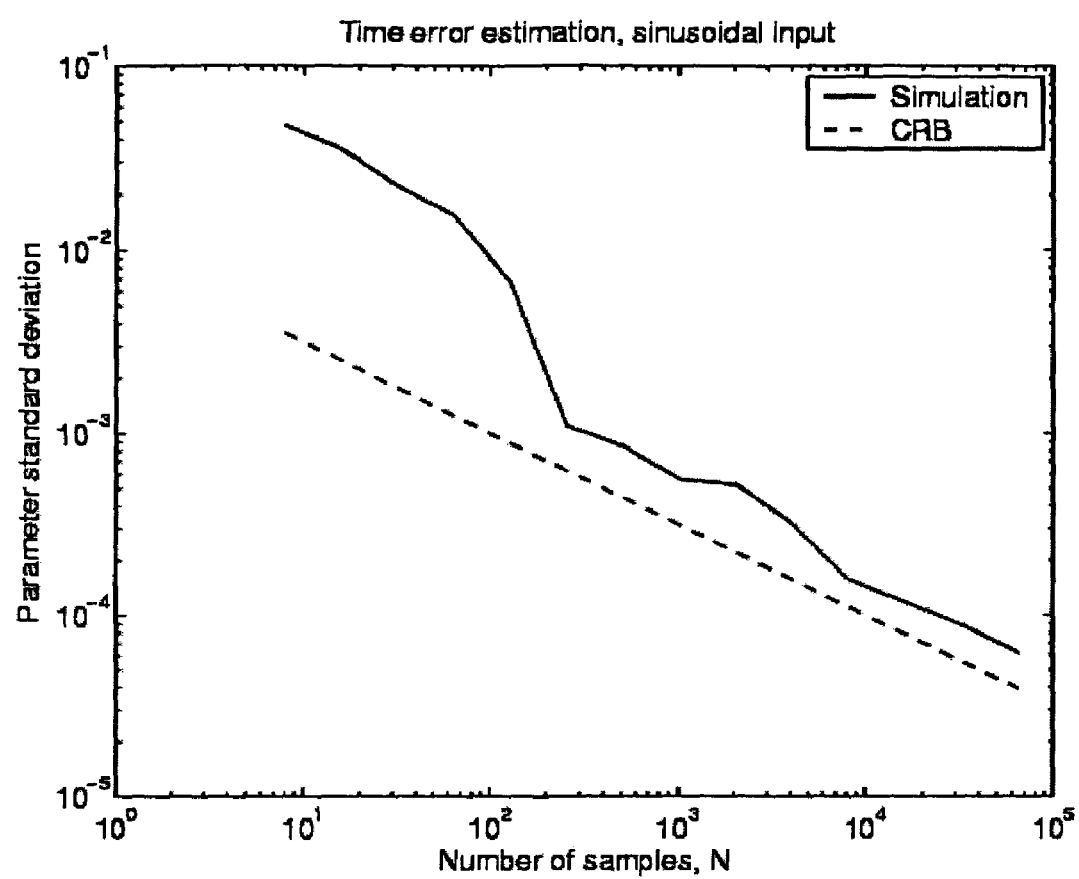
FIG. 4 is a diagram illustrating how the estimation accuracy improves with increased number of data.

The estimation algorithm has been evaluated with simulation with three different input signals: sinusoidal signals, multisine signals and band limited white noise. The algorithm has also been tested with additive white noise on the input and random jitter on the clock. The simulations show that the estimation algorithm works for a wide range of signals and that it also is robust to noise and random jitter. In FIG. 3 a single sinusoidal signal is used as input signal u(t) to the ADC system. The upper plot shows the spectrum of the output signal from the ADC system before time error estimation and correction, y. The lower plot shows the output signal from the correction device after time error estimation and compensation, z. In FIG. 4 the time error estimation accuracy is shown for different number of data. The input signal, u(t), is here a single sinusoid. The time error estimation accuracy is in this figure also compared to the Cramer-Rao bound that is the best that can be achieved with that amount of data.

High-speed A/D converters are needed in many applications. One way to increase the sampling speed is to use several A/D converters in parallel, interleaved in time. Each A/D converter can then operate at a lower speed, while the whole system performs a high sample rate. A problem with the time-interleaved structure is that mismatch errors are introduced. In this description a method and device for estimation and compensation of the time errors has been presented. The estimation can be done online when the A/D converter is used and requires no special calibration signal. An estimation algorithm with simulations has also been verified. The simulations have shown that the estimation method works well for many different kinds of signals, the only requirement was that the signal was band limited to the Nyquist frequency.

REFERENCES

[1] J. J. Corcoran. Timing and amplitude error estimation for timeinterleaved analog-to-digital converters. U.S. Pat. No. 5,294,926, October 1992.
[2] J. Elbomsson. Equalization of Distortion in A/D Converters. Lic. thesis 883, Department of Electrical Engineering, Linkoping University, Linkoping, Sweden, April 2001.
[3] J. Elbomsson and J.-E. Eklund. Blind estimation of timing errors in interleaved AD converters. In Proc. ICASSP 2001, volume 6, pages 3913{3916. IEEE, 2001.
[4] J. Elbomsson, K. Folkesson, and J.-E. Eklund. Measurement verification of estimation method for time errors in a time-interleaved A/D converter system. in Proc. ISCAS 2002. IEEE, 2002.
[5] J. Elbomsson, F. Gustafsson, and J.-E. Eklund. Amplitude and gain error inuence on time error estimation algorithm for time interleaved A/D converter system. in Proc. ICASSP 2002. IEEE, 2002.
[6] F. Gustafsson, L. Ljung, and M. Millnert. Digital Signalbehandling. Studentlitteratur, 2001. in Swedish.
[7] Y-C Jenq. Digital spectra of nonuniformly sampled signals: A robust sampling time offset estimation algorithm for ultra high-speed waveform digitizers using interleaving. IEEE Transactions on Instrumentation and Measurement, 39(1):71{75, February 1990.
[8] H. Jin and E. K. Lee. A digital-background calibration technique for minimizing timing-error effects in time-interleaved ADC's. IEEE Transactions on Circuits and Systems, 47(7):603{613, July 2000.

[9] L. Ljung. System Identification, Theory for the user. Prentice-Hall, 2 edition, 1999.
[10] A. Papoulis. Signal Analysis. McGraw-Hill, 1977.
[11] B. Widrow, I. Kollar, and M.-C. Liu. Statistical theory of quantization. IEEE Transactions on Instrumentation and Measurement, 45(2):353{361, April 1996.

What is claimed is:

1. A method for estimating time errors in a time interleaved A/D converter (ADC) system, comprising the steps of:
   calculating an output signal corrected with parameter estimates,
   calculating a mean square difference between adjacent ADCs,
   calculating a mean square for each compensated ADC output,
   calculating a loss function,
   calculating a gradient of the loss function, and
   updating the parameter estimates.

2. A method according to claim 1, wherein the parameter estimates are time error estimates.

3. A method according to claim 1, wherein the mean square difference for adjacent ADCs of M ADCs is calculated according to $$R_{z_i,z_{i-1}}^{(\Delta_t^{(n)})}[l] = \lim_{N \to \infty} \frac{1}{N} \sum_{k=1}^{N} E\left\{ \left( z_{(i \bmod M)}^{(\Delta_t^{(n)})} \left[ k + \left\lfloor \frac{li}{M} \right\rfloor + l \right] - z_{((i-1) \bmod M)}^{(\Delta_t^{(n)})} \left[ k + \left\lfloor \frac{li-1}{M} \right\rfloor \right] \right)^2 \right\}$$

$i = 0, \ldots, M - 1, l = 0, \ldots, L.$

4. A method according to claim 3, wherein the mean square for each compensated ADC output is calculated according to $$(\overline{\sigma}_{z_i}^2)^{(\Delta_{t_i}^{(n)})} = \lim_{N \to \infty} \frac{1}{N} \sum_{k=1}^{N} E\left\{ \left( z_i^{(\Delta_{t_i}^{(n)})}[k] \right)^2 \right\} \quad i = 0, \ldots, M - 1.$$

5. A method according to claim 4, wherein the loss function is calculated according to $$V(\hat{\Delta}^{(i)}) = \sum_{l=0}^{L} \sum_{i,j} \left( R_{z_i,z_{i-1}}^{(\Delta_t^{(n)})}[l] - R_{z_i,z_{i-1}}^{(\Delta_t^{L})}[l] \right)^2 + \beta \sum_{i,j} \left( (\overline{\sigma}_{z_i}^2)^{(\Delta_{ij}^{(n)})} - (\overline{\sigma}_{z_j}^2)^{(\Delta_{ij}^{(n)})} \right)^2.$$

6. A device for estimating time errors in a time interleaved A/D (ADC) converter system, comprising:
   means for calculating an output signal corrected with parameter estimates,
   means for calculating a mean square difference between adjacent ADCs,
   means for calculating a mean square for each compensated ADC output,
   means for calculating a loss function,
   means for calculating a gradient of the loss function, and
   means for updating the parameter estimates.

* * * * *